(12) United States Patent
Sato

(10) Patent No.: US 8,377,349 B2
(45) Date of Patent: Feb. 19, 2013

(54) METHOD OF MANUFACTURING A SEMICONDUCTOR DEVICE

(75) Inventor: Takashi Sato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 127 days.

(21) Appl. No.: 12/817,006

(22) Filed: Jun. 16, 2010

(65) Prior Publication Data

US 2011/0024930 A1    Feb. 3, 2011

(30) Foreign Application Priority Data

Jul. 29, 2009    (JP) ................................. 2009-176316

(51) Int. Cl.
B29C 45/76    (2006.01)
(52) U.S. Cl. ...................... 264/40.5; 264/40.1; 264/40.3
(58) Field of Classification Search ................. 264/40.1, 264/40.3, 40.5
See application file for complete search history.

(56) References Cited

U.S. PATENT DOCUMENTS

| | | | |
|---|---|---|---|
| 6,696,220 B2 * | 2/2004 | Bailey et al. .................. | 425/385 |
| 6,873,087 B1 | 3/2005 | Choi et al. | |
| 7,309,225 B2 | 12/2007 | McMackin et al. | |
| 8,047,828 B2 | 11/2011 | Suehira et al. | |
| 2002/0115002 A1 | 8/2002 | Bailey et al. | |
| 2005/0105093 A1 | 5/2005 | Tokita | |
| 2006/0267231 A1 | 11/2006 | Van Santen et al. | |
| 2006/0275524 A1 * | 12/2006 | Santen et al. .................. | 425/385 |
| 2008/0099941 A1 | 5/2008 | Suehira et al. | |
| 2009/0140445 A1 * | 6/2009 | Lu et al. ........................ | 264/40.1 |
| 2009/0174118 A1 | 7/2009 | Maeda et al. | |
| 2009/0283938 A1 | 11/2009 | Suehira et al. | |

FOREIGN PATENT DOCUMENTS

| | | |
|---|---|---|
| JP | 2005-108975 | 4/2005 |
| JP | 2006-516065 | 6/2006 |
| JP | 2006-332677 | 12/2006 |
| JP | 2007-19451 | 1/2007 |
| JP | 2007-139752 | 6/2007 |
| WO | WO 2004/013693 A2 | 2/2004 |

OTHER PUBLICATIONS

Uchida, N. et al., "A Dual Grating Alignment Method Insensitive to Mask-Wafer Gap Variation," Journal of the Japan society of Precision Engineering, vol. 54, No. 10, pp. 123-128, (1988).
Notification of Reason for Rejection issued by the Japanese Patent Office on Oct. 26, 2012, for Japanese Patent Application No. 2009-176316, and English-language translation thereof.

* cited by examiner

*Primary Examiner* — Robert J Grun
(74) *Attorney, Agent, or Firm* — Finnegan, Henderson, Farabow, Garrett & Dunner, L.L.P.

(57) ABSTRACT

A method of manufacturing a semiconductor device according to an embodiment includes bringing a pattern part for transfer formed on a template and a viscous material disposed on a material to be processed into contact with each other; and adjusting a distance between a surface of the material to be processed and a surface of the pattern part for transfer that faces the material to be processed so as to become a desired distance, in the contact situation of the pattern part for transfer and the viscous material.

5 Claims, 9 Drawing Sheets

FIG.4

| | LARGE | MIDDLE | SMALL |
|---|---|---|---|
| GAP | × | △ | ○ |
| PRESSURE | ○ | △ | × |

○ · · · SMALL DEFECT
△ · · · MIDDLE DEFECT
× · · · LARGE DEFECT

METHOD OF MANUFACTURING A SEMICONDUCTOR DEVICE

CROSS-REFERENCE TO RELATED APPLICATIONS

This application is based upon and claims the benefit of priority from Japanese Patent Application No. 2009-176316, filed on Jul. 29, 2009, the entire contents of which are incorporated herein by reference.

FIELD

Embodiments described herein relate generally to a method of manufacturing a semiconductor device.

BACKGROUND

As a conventional technique, a fine processing device is known that uses an imprinting method including an original board in which a pattern composed of a plurality of concave portions is formed, a substrate to be transferred whose surface is coated with a resist, alignment marks formed in the original board and the substrate to be transferred for an alignment, an alignment measurement means for measuring the relative displacement between the original board and the substrate to be transferred based on the alignment marks, and an alignment scope for measuring a gap between the original board and the substrate to be transferred.

According to the fine processing device, the gap is measured by the alignment scope and the relative displacement is measured by the alignment measurement means before the alignment mark of the original board comes into contact with the resist, so that the resist and the like on the substrate to be transferred do not adhere to the alignment mark, and the alignment measurement can be achieved with a high degree of accuracy, and the superposition accuracy of the original board and the substrate to be transferred.

However, in the recent years, defects of the transfer pattern or the like due to no filling of the resist into the concave portion of the pattern or due to a failure of adhesion between the concave portion of the pattern and the resist has been known, and it is difficult to eliminate the defects only by carrying out the superposition with a high degree of accuracy, so that they have become problematic.

BRIEF DESCRIPTION OF THE DRAWING

FIG. 4 is a table showing an example of a relationship between an evaluation value of defects of a transfer pattern and a gap and a pressure in the first embodiment;

DETAILED DESCRIPTION

A method of manufacturing a semiconductor device according to an embodiment includes bringing a pattern part for transfer formed on a template and a viscous material disposed on a material to be processed into contact with each other; and adjusting a distance between a surface of the material to be processed and a surface of the pattern part for transfer that faces the material to be processed so as to become a desired distance, in the contact situation of the pattern part for transfer and the viscous material.

[First Embodiment]

Hereinafter, an example of the method of manufacturing a semiconductor device will be explained. First, compositions of a processing device and a template used in an imprint process constituting the method of manufacturing a semiconductor are explained.

Figure 1:
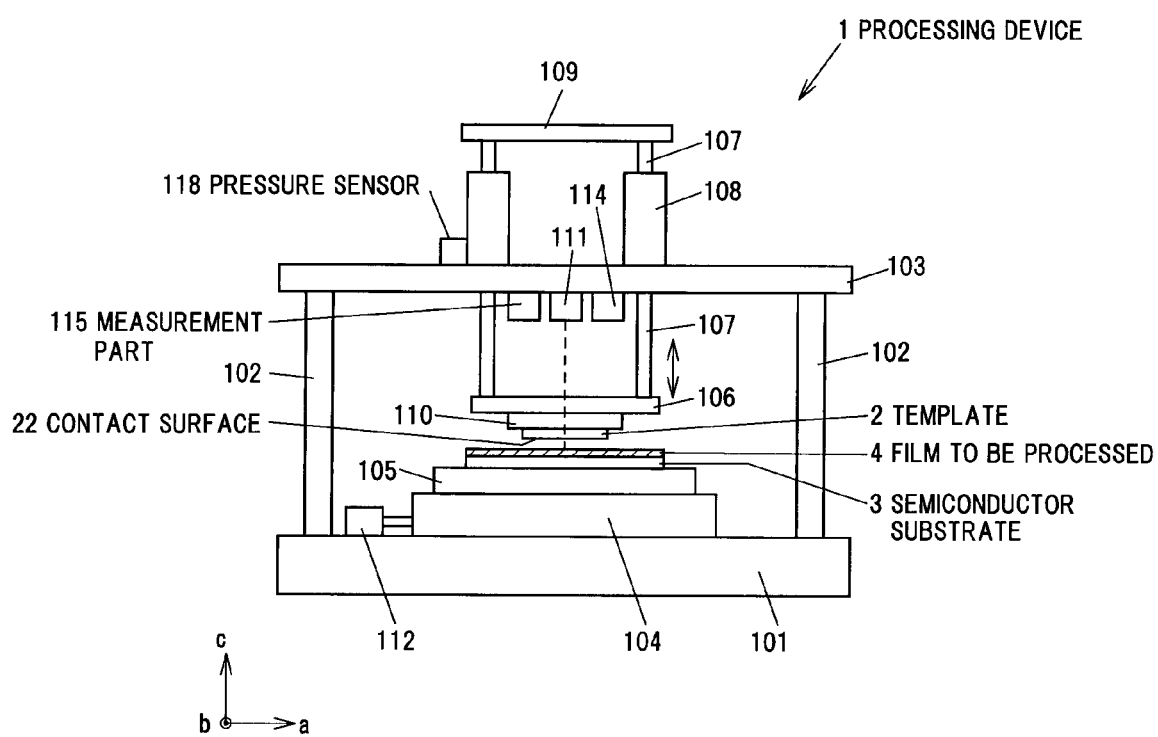
FIG. 1 is an explanatory view schematically showing a processing device used in a first embodiment.
Figure 2:
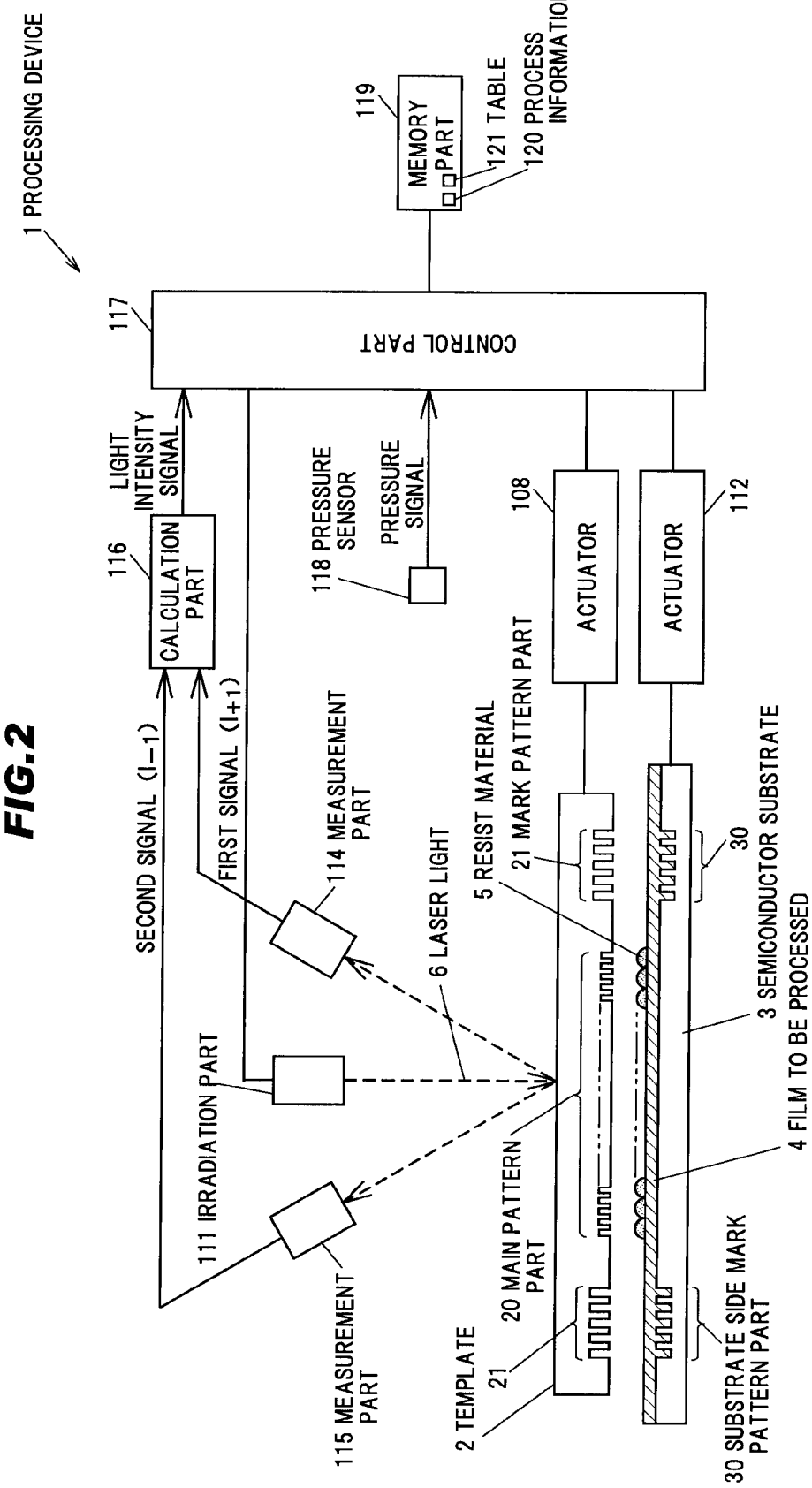
FIG. 2 is a function block diagram schematically showing a processing device used in the first embodiment.

FIG. 1 is an explanatory view schematically showing a processing device used in a first embodiment. FIG. 2 is a function block diagram schematically showing a processing device used in the first embodiment. Further, a, b and c in FIG. 1 respectively show a direction perpendicular to each other. In addition, the processing device 1 explained below is used for moving the template 2 in a direction of the semiconductor substrate 3, but the processing device 1 can be used for moving the semiconductor substrate 3 in a direction of the template 2 or moving both of them.

As shown in FIG. 1, the processing device 1 has a structure that a base plate 101 and a top board 103 are combined with a supporting column 102. An ab stage 104 is disposed on the base plate 101, and a chuck 105 for fixing the semiconductor substrate 3 by an electrostatic adsorption, vacuum adsorption or the like is disposed on the ab stage 104.

A plurality of actuators 108 for moving up and down an upper stage 106 by a plurality of guide bars 107 in a direction of the c axis are installed in the top board 103. Upper end parts of the guide bars 107 are combined with a guide plate 109. The ab stage 104 moves the chuck 105 in directions of the a axis and the b axis.

For example, a pressure sensor 118 is disposed on the top board 103. The pressure sensor 118 is disposed, for example, between a convex portion (Non-illustration) of the guide bar 107 located in a direction almost parallel to the top board 103 and the top board 103, measures a pressure generated between the two points and outputs the measured pressure as a pressure signal to a control part 117 described below. The control part 117 is formed so as to convert the pressure signal to a pressure generated between the template 2 and the resist material 5. Further, the pressure sensor 118 is not limited to the above-mentioned example, if it can measure the pressure, it can be used regardless of an installation location, a type and the like.

A template chuck 110 for fixing the template 2 by an electrostatic adsorption, vacuum adsorption or the like is installed in the upper stage 106. In addition, an irradiation part 111 for irradiating the resist material 5 formed on the semiconductor substrate 3 with an ultraviolet light via the upper stage 106, the template chuck 110 and the template 2 is disposed in the lower surface of the top board 103. An opening for allowing the ultraviolet light irradiated from the irradiation part 111 to pass through is formed in the upper stage 106 and the template chuck 110.

In addition, the irradiation part 111 also emits a laser light 6 used for an optical alignment of the main pattern part 20 other than the ultraviolet light. The laser light 6 is, for example, a He laser light having a wavelength of 633 nm.

An actuator 112 is installed in the ab stage 104 and is able to move the ab stage 104 in directions of the a axis and the b axis at the time of optical between the template 2 and the semiconductor substrate 3.

Further, a rear surface of the template 2 can be pushed to a side of semiconductor substrate 3 via a fluid (liquid or gas). Due to this, an influence of flatness in the rear surface of the template 2 can be reduced.

In addition, the processing device 1 includes measurement parts 114, 115 for measuring a diffraction light of the laser light 6 reflected from a region that has a one-dimensional lattice shape and is formed by that a mark pattern part 21 of the template 2 and a substrate side mark pattern part 30 of the semiconductor substrate 3 are superposed. The measurement parts 114, 115 output, for example, the incident diffraction light to a calculation part 116 as a first signal ($I_{+1}$) and a second signal ($I_{-1}$).

Further, as shown in FIG. 2, the processing device 1 includes the calculation part 116, the control part 117 and a memory part 119.

The calculation part 116 calculates a light intensity $\triangle I$ described below based on the first signal ($I_{+1}$) and the second signal ($I_{-1}$) outputted from the measurement parts 114, 115, and outputs a light intensity signal based on the calculated light intensity $\triangle I$ to the control part 117.

The control part 117 controls the irradiation part 111, the actuators 108, 112 and the like based on a process information 120 stored in the memory part 119 so as to control the manufacturing process of the semiconductor device.

The memory part 119, for example, includes a hard disk drive (HDD) and stores the process information 120 and a table 121. The process information 120 is information such as processes relating to a method of manufacturing a semiconductor device, parameters used for each process and the like. The table 121 will be described later.

Figure 3A:
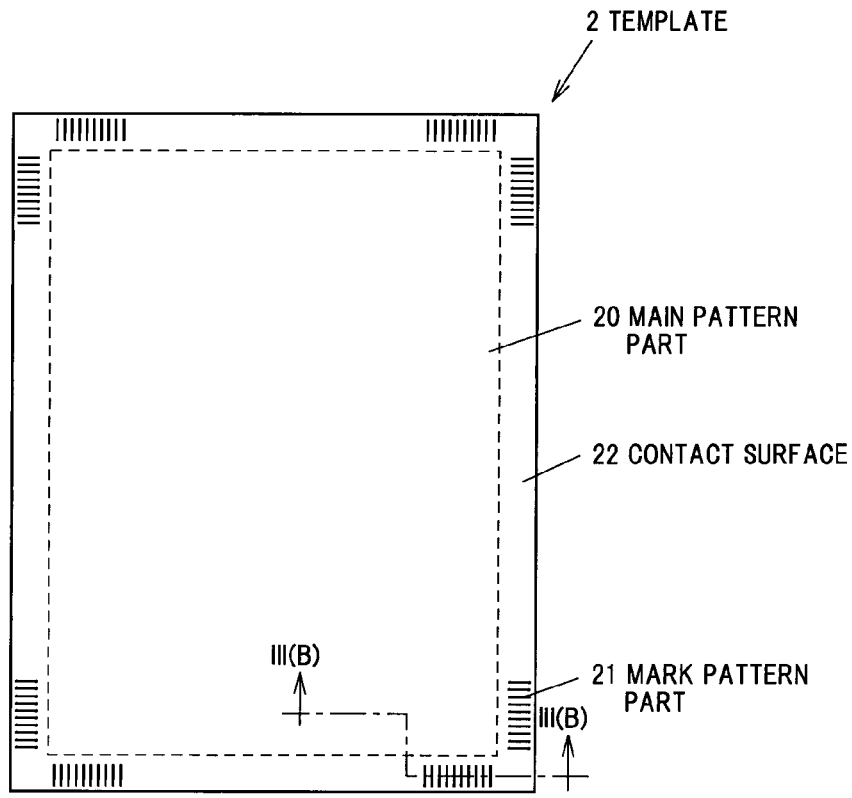
FIG. 3A is an explanatory view schematically showing a contact surface of a template used in the first embodiment.
Figure 3B:
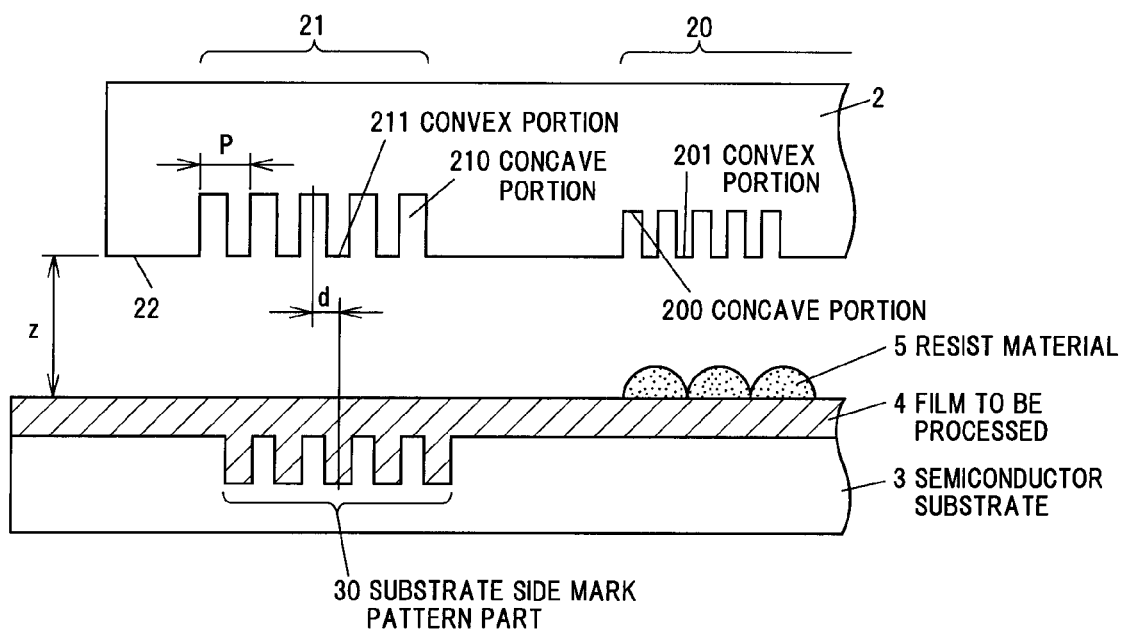
FIG. 3B is a cross-sectional view schematically showing an essential part of a semiconductor substrate and the template that are set to the processing device.

FIG. 3A is an explanatory view schematically showing a contact surface of a template used in the first embodiment. FIG. 3B is a cross-sectional view schematically showing an essential part of a semiconductor substrate and the template that are set to the processing device. FIG. 3B shows cross-sections of the semiconductor substrate and the template taken along the line III-III in FIG. 3A.

As shown in FIGS. 3A and 3B, the template 2 roughly includes the contact surface 22 that is a side coming into contact with the resist material 5, the main pattern part 20 that is formed on the contact surface 22 and forms a mask part after the resist material 5 is filled and hardened, and the mark pattern part 21 that is formed on the contact surface 22 and is used for an optical alignment of the mask part.

The template 2 is formed of, for example, a light transmissive material to ultraviolet light such as a quarts material.

The main pattern part 20 as a pattern part for transfer is used as, for example, a mold for forming a circuit pattern of a semiconductor element or the like and as shown in FIG. 3B, includes a plurality of concave portions 200 and a plurality of convex portions 201.

For example, a plurality of the mark pattern parts 21 as a first pattern part for an optical alignment are formed around the main pattern part 20 in a different direction. The mark pattern part 21 forms a pattern that, for example, a plurality of lines are arranged at equal intervals by that a plurality of the concave portions 210 and a plurality of the convex portions 211 are arranged at equal intervals when viewed from a side of the contact surface 22. In addition, with regard to the measurement of relative displacement between the template and the semiconductor substrate 3, only the relative displacement in a direction parallel to a direction that the lines are arranged can be measured from single mark pattern part 21, but the relative displacement in the directions of the a axis and the b axis can be measured by that the mark pattern part 21 having a different angle by 90 degrees in the direction that the lines are arranged is further arrange. Further, a pattern of the main pattern part 20 can be also used as a pattern for an optical alignment.

The semiconductor substrate 3 is formed, for example, a silicon based material, and a plurality of the substrate side mark pattern part 30 are formed thereon corresponding to the mark pattern part 21 of the template 2. The substrate side mark pattern part 30 is formed, for example, so as to have a concave and convex portion having almost the same width and interval as the concave portion 210 and the convex portion 211 of the mark pattern part 21.

The film to be processed 4 is formed of, for example, a silicon nitride, a silicon oxide, a metallic material or the like, and formed of a single film or a plurality of films. Further, a material to be processed is not limited to the film to be processed 4, but the semiconductor substrate 3 can be also used.

The resist material 5 as the viscous material is, for example, an ultraviolet cure resist and is formed of an ultraviolet cure resin that is hardened by irradiation of ultraviolet. Further, the resist material 5 is not limited to the ultraviolet cure resist, but for example, a resist material that is hardened by that the hardening process is applied thereto in a state of being filled in the template 2, such as a resist material that is hardened by that heat is applied thereto, a resist material that is hardened by that after an energy ray is applied thereto, heat is applied thereto can be also used.

Here, a gap z, a relative location difference d and a pitch P shown in FIG. 3B will be explained. The gap z is a distance between the surface of the film to be processed 4 and the surface of the mark pattern part 21 facing the film to be processed 4, but is also a distance between the surface of the film to be processed 4 and the surface of the main pattern part 20, since both distances from the surfaces of the main pattern part 20 and the mark pattern part 21 to the surface of the film to be processed 4 are equal to each other. The relative location difference d is an amount of relative displacement between the mark pattern part 21 of the template 2 and the substrate side mark pattern part 30 of the semiconductor substrate 3. The pitch P is a distance between the concave portions 210 of the mark pattern part 21.

FIG. 4 is a table showing an example of a relationship between an evaluation value of defects of a transfer pattern and a gap and a pressure in the first embodiment. The evaluation value of defects of the transfer pattern means, for example, a number of the defects, a rate of the defects, an area ratio of the transfer pattern and the defects. The gap in FIG. 4 means a distance between the surface of the main pattern part 20 and the surface of the film to be processed 4.

With regard to the gap, for example, as shown in FIG. 4, there is a tendency that the smaller the gap is, the higher the evaluation value is, and the larger the gap is, the lower the evaluation value is. This is due to the fact that, for example, there is a tendency that the smaller the gap is, the more the resist material 5 can be tightly filled in the concave portion 200 of the main pattern part 20, and the larger the gap is, the more the space is generated between the concave portion 200 and the resist material 5 so that defects are easily generated. In addition, for example, there is a tendency that the higher the pressure is, the more the resist material 5 can be tightly or adhesively filled in the concave portion 200, and the smaller the pressure is, the more the space is generated and the less the adhesiveness becomes so that defects are easily generated. In FIG. 4, a circle mark (○) shows that defects is small in the number and it is an optimal condition, a triangle mark (Δ) shows that defects is medium in the number and it is a suitable condition, and a cross mark (x) shows that defects is large in the number and it is an unsuitable condition.

The table 121 stores information about the gap and the pressure as shown in FIG. 4. Due to the table 121, the control part 117 adjusts the gap z and the pressure based on combinations for reducing the defects of the transfer pattern. The control part 117 controls the actuator 108 and the like, for example, based on the values of the gap and the pressure for carrying out the combination of "gap is small" and "pressure is large" due to the table 121, if the combination of "gap is small" and "pressure is large" can be carried out, the combination being capable of reducing the generation of the defects of the transfer pattern in the number. Each value of the table 121 is obtained by, for example, an experiment or a simulation.

Hereinafter, an example of a calculation method of the gap z as a desired distance will be explained. By measuring a diffraction light from a side of the film to be processed 4 due to the calculation method, the gap z can be easily measured. Further, for the calculation method, "A Dual Grating Alignment Method Insensitive to Mask-Wafer Gap Variation" by Norio Uchida, Yoriyuki Ishibashi, Ryoichi Hirano, Nobutaka Kikuiri and Mitsuo Tabata, Journal of the Japan Society of Precision Engineering, Vol. 54, No. 10, p123-128, 1988 has been referred to. Further, hereinafter, an explanation is carried out on the basis that both distances from the surfaces of the main pattern part 20 and the mark pattern part 21 to the surface of the film to be processed 4 are equal to each other, but a case that both distances are different from each other will be explained later.

First, in a system shown in FIG. 2, assuming that the laser light 6 (wavelength is λ) emitted from the irradiation part 111 enters perpendicularly to the template 2, an n-dimensional light intensity $I_n$ of a diffraction light reflected from a region that is formed so as to have a one-dimensional lattice shape by that the mark pattern part 21 and the substrate side mark pattern part 30 are superposed can be represented as the following formula (1).

$$I_n = |A \Sigma_k \Sigma_j C_j \cdot C_{k-j} \cdot C_{n-k} \exp(-2\pi i\{(k-j)X+(k^2+j^2)Z\})| \quad (1)$$

Here, each variable number is as follows.
A: Constant
d: Relative location difference
P: Pitch
z: Gap
$C_j$ and $C_{n-k}$: Fourier coefficient in a side of the template 2.
$C_{k-j}$: Fourier coefficient in a side of the semiconductor substrate 3.
In addition, the following formulae (2) and (3) are used.

$$X = d/P \quad (2)$$

$$Z = \lambda z/2P^2 \quad (3)$$

Next, for example, the following formula (4) is calculated from a first signal ($I_{+1}$) based on a (+1)-dimensional diffraction light outputted from the measurement parts 114, 115 and a second signal ($I_{-1}$) based on a (−1)-dimensional diffraction light.

$$\Delta I = I_{+1} - I_{-1} \quad (4)$$

From the formula (4), a light intensity ΔI of a diffraction light can be calculated based on the following formulae considering only the terms whose diffraction order is zero-order and ±one-order.

$$\Delta I \propto 1/\pi^4 (\sin 6\pi Z + \sin 10\pi Z) \sin 2\pi X + 4/\pi^6 \sin 8\pi Z \sin 4\pi X \quad (5)$$

Figure 5:
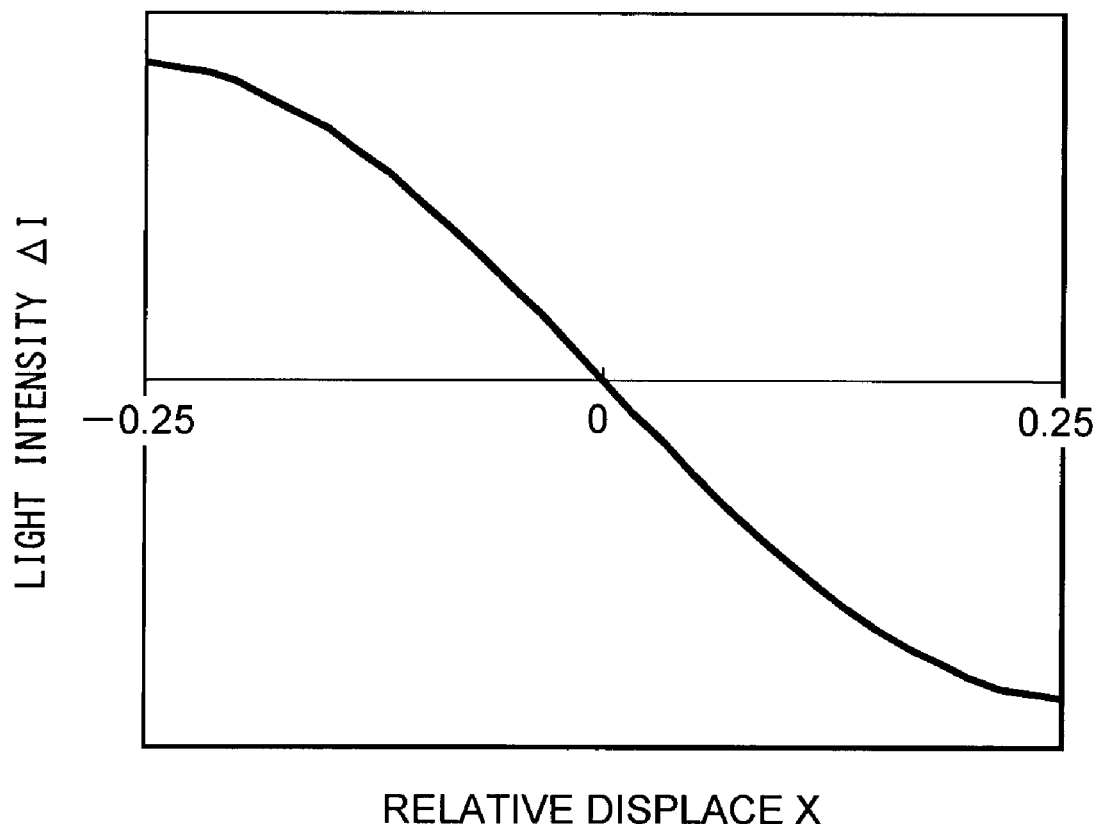
FIG. 5 is a graph showing a relationship between a relative displacement X and a light intensity ΔI in the first embodiment.

FIG. 5 is a graph showing a relationship between a relative displacement X and a light intensity ΔI in the first embodiment. FIG. 5 shows, as an example, a relationship between X and ΔI in the case of assigning Z=0.2 to the above-mentioned formula (5). The formula (5) can be represented as the following formula (6), when a coefficient of sin 2πX is defined as α and a coefficient of sin 4πX is defined as β.

$$\Delta I \propto \alpha \sin 2\pi X + \beta \sin 4\pi X \quad (6)$$

From the formula (6), it is understood that the light intensity ΔI has a maximum value when X=0.25. Then, X=0.25 is assigned to the formula (5) so that the formula (7) can be obtained.

$$\Delta I \propto 2/\pi^4 \sin 8\pi Z \cos 2\pi Z \quad (7)$$

Figure 6:
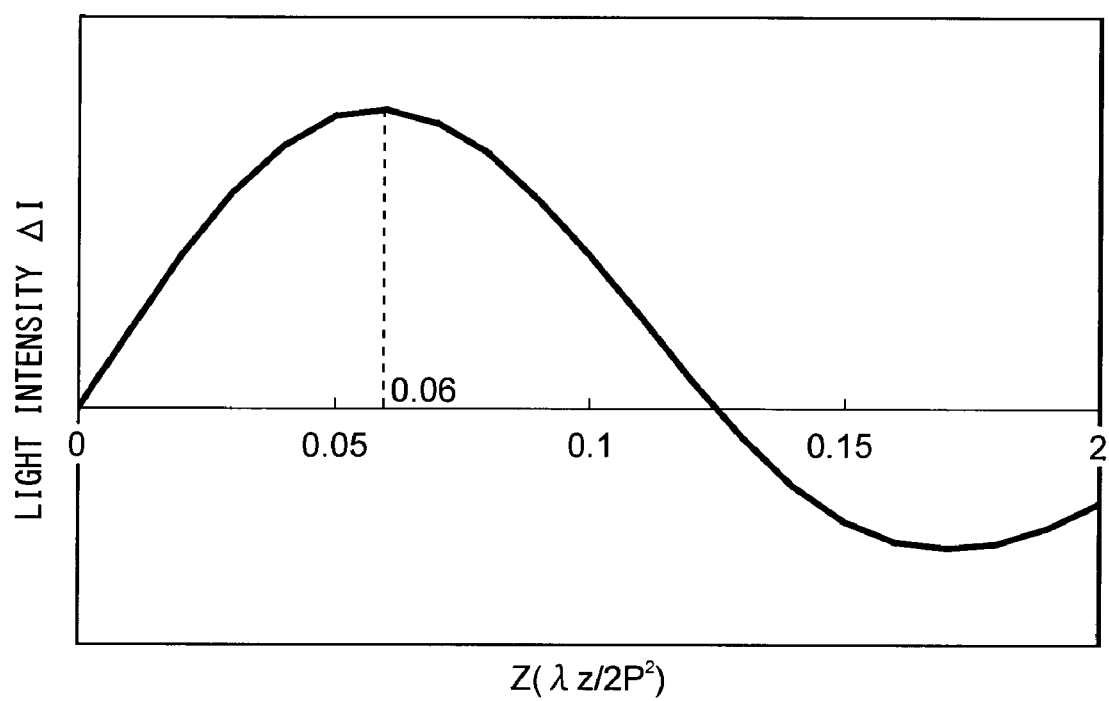
FIG. 6 is a graph showing a relationship between Z and ΔI in a formula (7) in the first embodiment.

FIG. 6 is a graph showing a relationship between Z and ΔI in a formula (7) in the first embodiment. As shown in FIG. 6, the light intensity ΔI has a maximum value when Z=0.06. For example, when each value of the gap z=15 nm, and wavelength of laser light=633 nm used in the method of manufacturing the semiconductor device by the processing device 1 is assigned to the formula (3), pitch P=280 nm is calculated. Namely, when pitch P=280 nm, the template 2 and the semiconductor substrate 3 are moved to a location of the relative location difference d=70 nm satisfying the relative dislocation X=0.25, so that the template 2 can be moved to a location of the gap z=15 nm. Further, for example, patterns having a plurality of pitches corresponding to a plurality of the gaps z are formed in the template 2 and the semiconductor substrate 3, and the light intensity ΔI of each pattern is measured, so that a plurality of the gaps z can be measured.

Hereinafter, an example of a method of manufacturing a semiconductor device according to the embodiment will be explained.

FIGS. 7A to 7F are cross-sectional views respectively showing an essential part of each step of a method of manufacturing a semiconductor device according to the first embodiment. Hereinafter, a He laser light having a wavelength of 633 nm is used as the laser light 6 and the pitch P is defined as 280 nm.

First, the resist material 5 having a shape of, for example, a droplet is disposed on the film to be processed 4 formed on the semiconductor substrate 3 fixed to the chuck 105. The resist material 5 is disposed, for example, in a place corresponding to the main pattern part 20 on the film to be processed 4 so that each droplet is the same in quantity.

Next, the template 2 is fixed to the template chuck 110 of the processing device 1 so that the contact surface 22 in which the main pattern part 20 and the mark pattern part 21 of the template 2 are formed is located in a side of the XY stage 104. Subsequently, the contact surface 22 and the semiconductor substrate 3 are arranged so as to face each other.

Figure 7A:
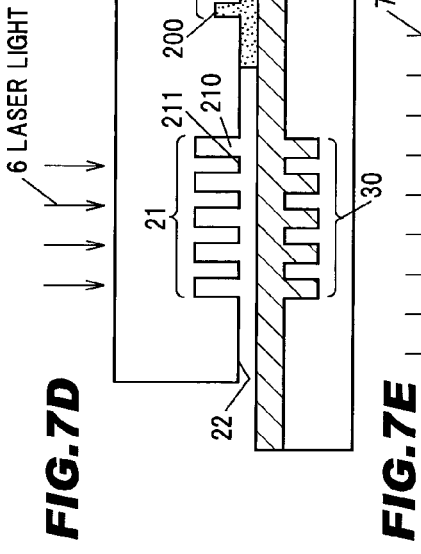
FIGS. 7A to 7F are cross-sectional views respectively showing an essential part of each step of a method of manufacturing a semiconductor device according to the first embodiment.

Next, as shown in FIG. 7A, the main pattern part 20 formed on the template 2 and the resist material 5 formed on the film to be processed 4 are brought into contact with each other.

In particular, the control part 117 determines a contact state of the template 2 and the resist material 5 based on a pressure signal outputted from the pressure sensor 118 while lowering the template 2 via the actuator 108, and after determining the contact state, it stops the template 2 being lowered. Subsequently, in order to move the semiconductor substrate 3 from a location of the light intensity ΔI=0 to a location of the relative location difference d=70 nm where X=0.25, first, the control part 117 moves the semiconductor substrate 3 in directions of the a axis and the b axis via the actuator 112 to a location of d=0. Sequentially, the control part 117 moves the semiconductor substrate 3 in directions of the a axis and the b axis via the actuator 112 from a location of X=0 to a location of the relative location difference d=70 nm where X=0.25. Further, an amount of the moving of the semiconductor substrate 3 can be calculated, for example, from an amount of displacement of the actuator 112, or can be measured from an amount of the moving of the ab stage 104 with a laser interferometer. Further, in the above, the semiconductor substrate 3 is moved, but the template 2 or both of them can be also moved.

Figure 7B:
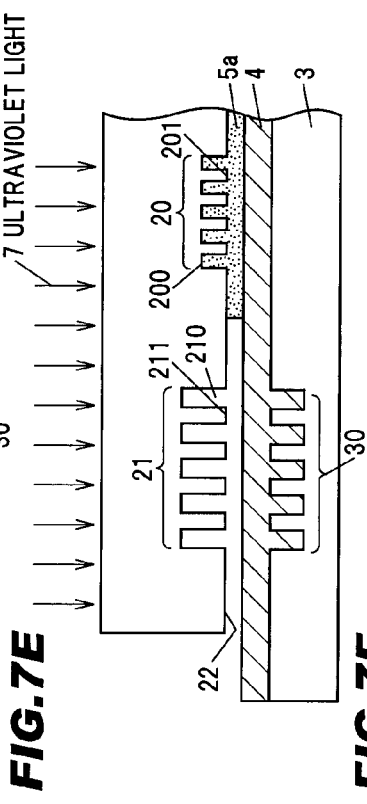

Next, as shown in FIG. 7B, in the contact state of the main pattern part 20 and the resist material 5, the gap z between the surface of the film to be processed 4 and the surface of the main pattern part 20 facing the film to be processed 4 is adjusted so that the gap z becomes a desired gap of Z=15 nm. The adjustment of the distance is carried out by irradiating a region that is formed by that the mark pattern part 21 formed in the template 2 and the substrate side mark pattern part 30 formed in a side of film to be processed 4, namely on the semiconductor substrate 3 are superposed, with the laser light 6 via the upper stage 106, the template chuck 110 and the template 2, measuring a light intensity ΔI of a diffraction light emitted from the region, and using the measured light intensity as a basis of the adjustment.

Figure 7C:
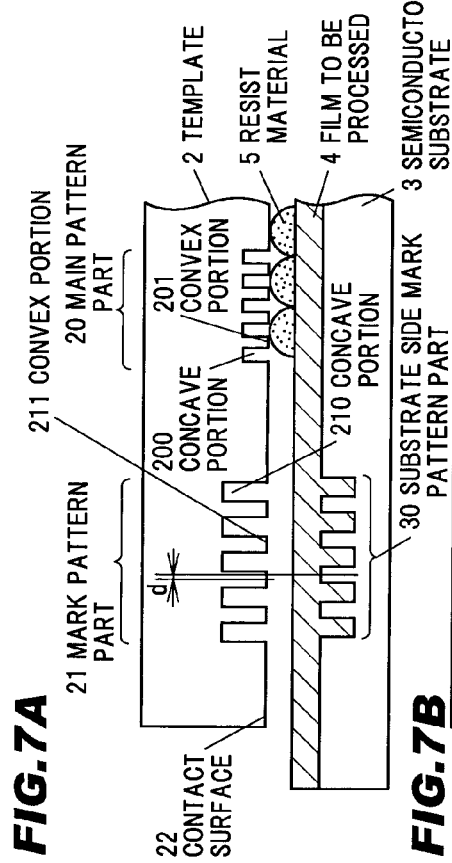

In particular, the irradiation part 111 irradiates a region having a one-dimensional lattice shape formed by that the mark pattern part 21 and the substrate side mark pattern part 30 are superposed with the laser light 6. Subsequently, the measurement parts 114, 115 measures the diffraction light emitted from the region of the one-dimensional lattice shape by irradiation of the laser light 6, and outputs the first and second signals to the calculation part 116. Subsequently, the calculation part 116 calculates the light intensity ΔI based on the first and second signals from the above-mentioned formula (4), and based on the calculated light intensity ΔI, outputs a light intensity signal to the control part 117. Subsequently, the control part 117 moves the template 2 to a location at which the light intensity ΔI becomes maximal via the actuator 108 in a direction of the c axis. At this time, the control part 117 moves the template 2 so that the light intensity ΔI becomes maximal while controlling the gap and the pressure based on the table 121. After reaching a desired gap z, as shown in FIG. 7C, the resist material 5 is filled in the concave portion 200 of the main pattern part 20.

At this time, a resist material film 5a is formed between the template 2 and the semiconductor substrate 3, and in the concave portion 200 by the filled resist material 5.

Figure 7D:
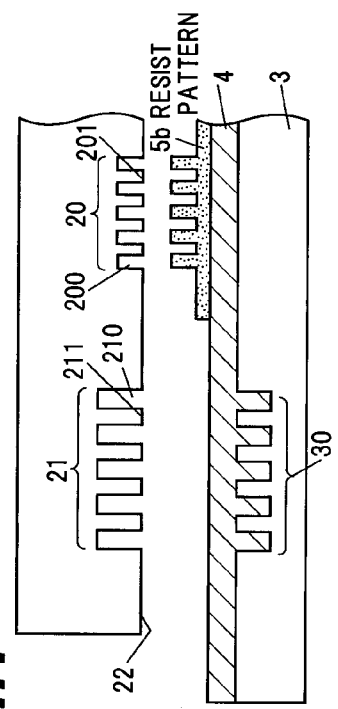

Next, as shown in FIG. 7D, the laser light 6 is irradiated from the irradiation part 111 to the semiconductor substrate 3 via the upper stage 106, the template chuck 110 and the template 2, an alignment of the template 2 and the semiconductor substrate 3 is carried out.

In particular, for example, by irradiating the laser light 6, interference stripes formed by the diffraction light emitted from the region of the one-dimensional lattice shape formed by that the mark pattern part 21 and the substrate side mark pattern part 30 are superposed is measured by the measurement parts 114, 115, the actuator 112 is driven and the ab stage 114 is moved so that the interference stripes are disposed at equal intervals, and the location of the semiconductor substrate 3 is adjusted. Further, the alignment of the template 2 and the semiconductor substrate 3 can be also carried out by moving the template 2, and can be also carried out by adjusting the template 2 or the semiconductor substrate 3 based on inclining it or deforming it due to adding a pressure to it.

Figure 7E:
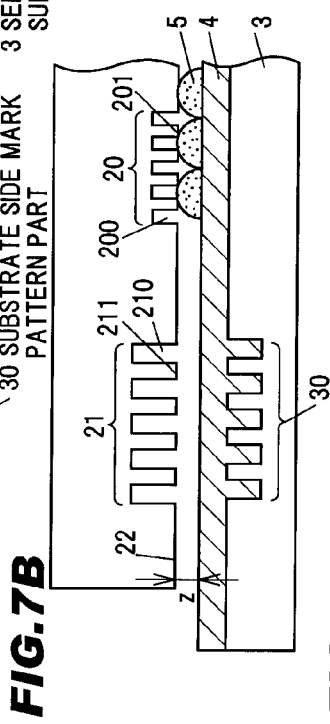

Next, as shown in FIG. 7E, after the alignment of the template 2 and the semiconductor substrate 3 is completed, an ultraviolet light 7 is irradiated from the irradiation part 111 to the resist material film 5a via the upper stage 106, the template chuck 110 and the template 2.

Figure 7F:
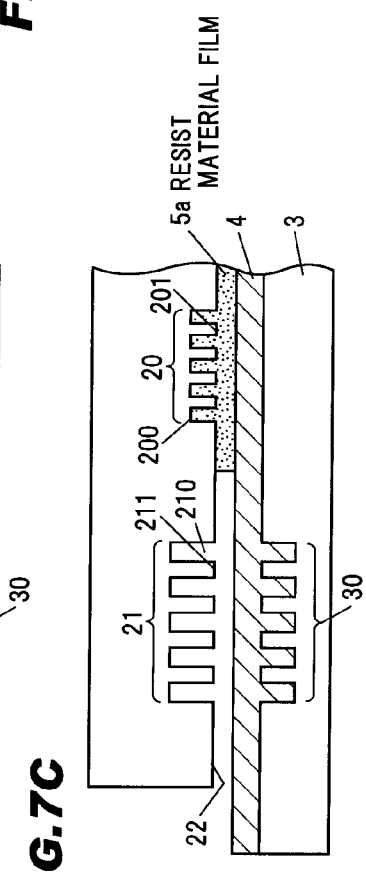

Next, as shown in FIG. 7F, after the resist material film 5a is hardened, the actuator 108 is driven and the upper stage 106 is moved up so that the resist pattern 5b that is a transfer pattern formed by that the main pattern part 20 formed in the template 2 is transferred is formed on the film to be processed 4. When the imprint process is carried out based on the optimal gap z and pressure, the defects of the transfer pattern due to no filling of the resist material 5 into the concave portion 200 of the main pattern part 20, an adhesion failure between the concave portion 200 and the resist material 5, or the like can be prevented.

Subsequently, after the resist pattern 5b is etched back so as to expose a part of the film to be processed 4, a process of carrying out an etching by using the remaining resist pattern as a mask and the like are passed through, and a desired semiconductor device can be obtained.

[Second Embodiment]

Figure 8:
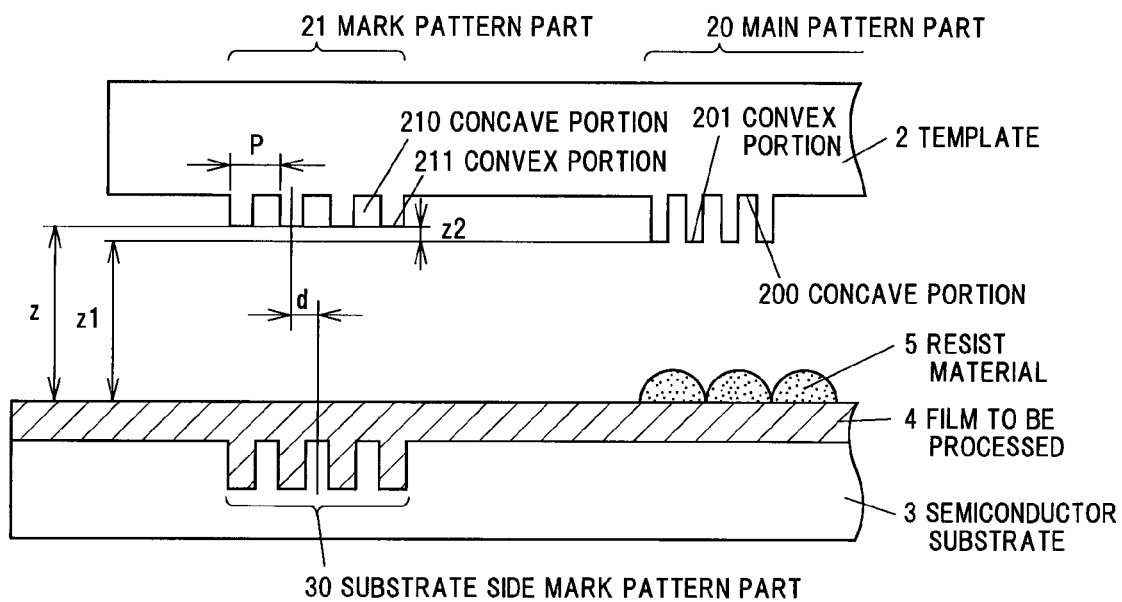
FIG. 8 is a cross-sectional view schematically showing an essential part of the template and the semiconductor substrate used in a second embodiment.

FIG. 8 is a cross-sectional view schematically showing an essential part of the template and the semiconductor substrate used in a second embodiment. The embodiment differs from the first embodiment in that the convex portions 201, 211 of the main pattern part 20 and the mark pattern part 21 are formed so as to project form the contact surface 22 of the template 2 and heights of the convex portions 201, 211 are different from each other. Hereinafter, with regard to elements having the same construction and function as those of the first embodiment, the same references as those of the first embodiment will be used, and detail explanation will be omitted.

A gap between the convex portion 201 of the main pattern part 20 and the surface of the film to be processed 4 is z1, and difference of length between the convex portion 211 of the mark pattern part 21 and the convex portion 201 of the main pattern part 20 is z2, so that the gap z between the convex portion 211 of the mark pattern part 21 and the surface of the film to be processed 4 is z1+z2. Consequently, in order that the light intensity ΔI becomes large when the template 2 is located so as to keep a desired gap, namely a gap z1 between the convex portion 201 of the main pattern part 20 and the surface of the film to be processed 4, z1+z2 is assigned to the gap z of the above-mentioned formula (3) and the pitch P is calculated. The processing device 1 carries out the imprint process based on the calculated gap z and the like.

[Third Embodiment]

Figure 9A:
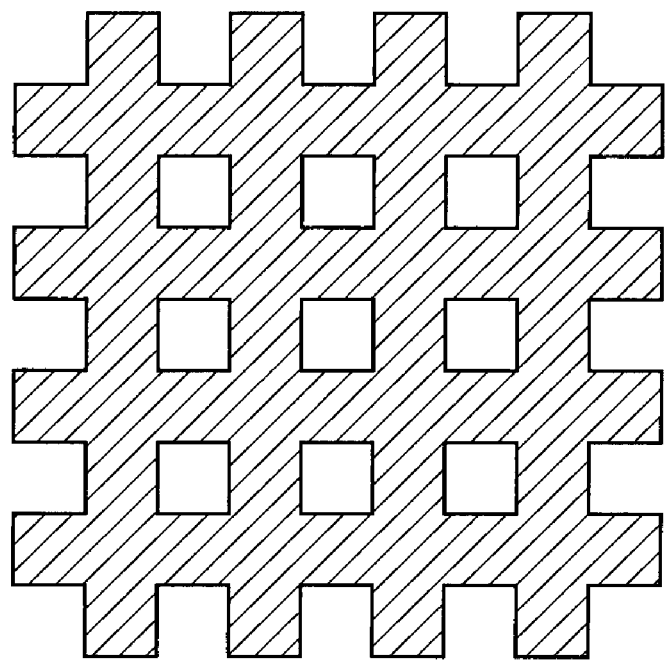
FIGS. 9A and 9B are explanatory views schematically showing a region formed by that a mark pattern part and a substrate side mark pattern part are superposed in a third embodiment.
Figure 9B:
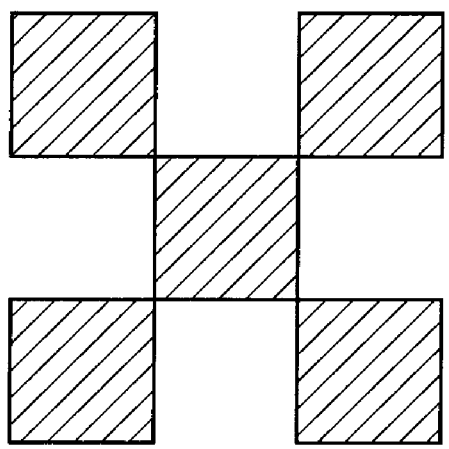

FIGS. 9A and 9B are explanatory views schematically showing a region formed by that a mark pattern part and a substrate side mark pattern part are superposed in a third embodiment. FIG. 9A shows a two-dimensional lattice pattern and FIG. 9B shows a checker lattice pattern. The embodiment differs from the other embodiments in that the region of the lattice shape has the two-dimensional lattice pattern and the checker lattice pattern. Further, shaded parts in FIGS. 9A and 9B show shapes formed when the concave portions formed in the mark pattern part 21 and the substrate side mark pattern part 30 are superposed.

The processing device 1 in the embodiment has four measurement parts, for example, the four measurement parts are arranged at each corner of a square. The processing device 1 is able to carry out the alignment of the template 2 and the semiconductor substrate 3 by measuring a two-divisional dislocation instead of a one-dimensional dislocation due to the light intensity ΔI of the diffraction light from the two-dimensional lattice pattern and the checker lattice pattern.

[Fourth Embodiment]

The embodiment differs from the other embodiments in that the adjustment of the gap z includes adjusting a speed until the gap z between the main pattern part 20 and the resist material 5 that are in a contact situation becomes a desired distance.

Here, there is a tendency that the larger the speed is, the more the resist material 5 can be tightly and adhesively filled in the concave portion 200 of the main pattern part 20, and the smaller the speed is, the more the space is generated and the adhesion lowered, so that defects are easily generated.

The control part 117 calculates the speed of the template 2 due to, for example, a driving amount and a driving time of the actuator 108. The control part 117 obtains the optimal speed for reducing the defects due to, for example, an experiment or a simulation, and stores it in the table 121. The control part 117 controls the imprint process based on, for example, the optimal speed, pressure and gap z. Further, it can be also adopted that a device for measuring a distance between the template 2 and the semiconductor substrate 3 is installed in the processing device 1, and the speed is calculated from the measured distance and time. In addition, it can be also adopted that acceleration is calculated from the speed, the optimal acceleration for reducing the defects is calculated based on an experiment or a simulation, it is stored in the table 121, and it is utilized at the time of the imprint process.

Further, in each of the above-mentioned embodiments, for example, the resist material 5 can be coated on the surface of the semiconductor substrate 3 in a thin film-like shape by using a spin coater or the like.

According to the above-explained embodiments, the defects of the transfer pattern in the imprint process can be prevented. In addition, the defects of the transfer pattern can be prevented, so that manufacturing cost of the semiconductor device can be reduced.

While certain embodiments have been described, these embodiments have been presented by way of example only, and not intended to limit the scope of inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such form or modifications as would fall within the scope and spirit of the inventions.

What is claimed is:

1. A method of manufacturing a semiconductor device, comprising:

bringing a pattern part for transfer formed on a template and a viscous material disposed on a material to be processed into contact with each other; and adjusting a distance between a surface of the material to be processed and a surface of the pattern part for transfer that faces the material to be processed to a desired distance, in a contact situation of the pattern part for transfer and the viscous material, the adjusting of the distance including adjusting a pressure after the pattern part for transfer and the viscous material are brought into contact with each other, wherein the adjusting of the distance is carried out by irradiating a region that is formed by superposing a first pattern part for an optical alignment formed in the template and a second pattern part for an optical alignment formed in a side of the material to be processed with a light via the template, measuring a light intensity of a diffraction light emitted from the region, and using the measured light intensity as a basis of the adjusting, the first pattern part being formed of a pattern having a plurality of concave portions and a plurality of convex portions arranged at equal intervals, and the adjusting of the distance and the pressure is carried out based on a relationship between an evaluation value of defects of a transfer pattern formed by transferring the pattern part for transfer onto the viscous material, and the distance and the pressure, the relationship being obtained by an experiment or a simulation.

2. The method of manufacturing a semiconductor device according to claim 1, wherein the first and second pattern parts are formed of a two-dimensional lattice pattern or a checker lattice pattern.

3. The method of manufacturing a semiconductor device according to claim 1, further comprising:

obtaining an optimal speed of the template by an experiment or a simulation, wherein the adjusting of the distance includes adjusting a speed of the template to become the optimal speed, until the distance between the pattern part for transfer and the viscous material that are in the contact situation becomes the desired distance.

4. The method of manufacturing a semiconductor device according to claim 2, further comprising:

obtaining an optimal speed of the template by an experiment or a simulation, wherein the adjusting of the distance includes adjusting a speed of the template to become the optimal speed, until the distance between the pattern part for transfer and the viscous material that are in the contact situation becomes the desired distance.

5. The method of manufacturing a semiconductor device according to claim 1, wherein the pattern part for transfer has a plurality of concave portions and a plurality of convex portions, heights of the convex portions of the pattern part for transfer being different from heights of the convex portions of the first pattern part.

* * * * *